United States Patent [19]
Hiyama et al.

[11] Patent Number: 5,225,705
[45] Date of Patent: Jul. 6, 1993

[54] SEMICONDUCTOR STRESS SENSOR MESFET OR MESFET ARRAY

[75] Inventors: Satoshi Hiyama; Katuhiko Takebe, both of Tokyo; Katsuki Ichinose, Saitama, all of Japan

[73] Assignee: Honda Giken Kogyo Kabushiki Kaisha, Tokyo, Japan

[21] Appl. No.: 862,306

[22] Filed: Apr. 2, 1992

[30] Foreign Application Priority Data

Apr. 2, 1991 [JP] Japan ................................. 3-96358

[51] Int. Cl.[5] .............................................. H01L 29/84
[52] U.S. Cl. ...................................... 257/415; 257/418; 257/417; 257/419; 73/517 R; 73/777
[58] Field of Search ............... 257/414, 415, 417, 418, 257/419; 280/735; 73/777, 517 R

[56] References Cited

U.S. PATENT DOCUMENTS

| | | | |
|---|---|---|---|
| 3,641,812 | 2/1972 | Vick | 73/777 X |
| 4,005,318 | 1/1977 | Claiborne, Jr. | 257/415 X |
| 4,191,057 | 3/1980 | Busta | 73/777 |
| 4,633,099 | 12/1986 | Tanabe et al. | 257/419 X |
| 4,885,621 | 12/1989 | Yoder et al. | 257/419 |

FOREIGN PATENT DOCUMENTS

| | | |
|---|---|---|
| 0040795 | 2/1981 | Fed. Rep. of Germany . |
| 0177802 | 4/1986 | Fed. Rep. of Germany . |
| 2074759 | 8/1971 | France . |
| 2143553 | 9/1973 | France . |
| 2-194343 | 10/1990 | Japan . |
| 2011707 | 11/1979 | United Kingdom . |

OTHER PUBLICATIONS

Reeder et al., "Surface-Acoustic-Wave Pressure and Temperature Sensors", Proceedings of the IEEE, vol. 64, No. 5, May 1976, pp. 754–756.
*Microelectronics*, "Paris Components–1970 organs and memories", May 1970, pp. 26–29, no author.

*Primary Examiner*—William Mintel
*Attorney, Agent, or Firm*—Irving M. Weiner; Joseph P. Carrier; Pamela S. Burt

[57] ABSTRACT

A semiconductor sensor has a plurality of field-effect transistors disposed on a semiconductor substrate at spaced intervals. The field-effect transistors have respective drains electrically connected parallel to each other, respective sources electrically connected parallel to each other, and gates electrically connected parallel to each other. While a gate bias voltage is being applied to each of the field-effect transistors, a stress applied to the semiconductor substrate is detected based on a change in a combined output of the field-effect transistors. A single comb-shaped field-effect transistor may be employed instead of the plurality of field effect transistors.

13 Claims, 7 Drawing Sheets

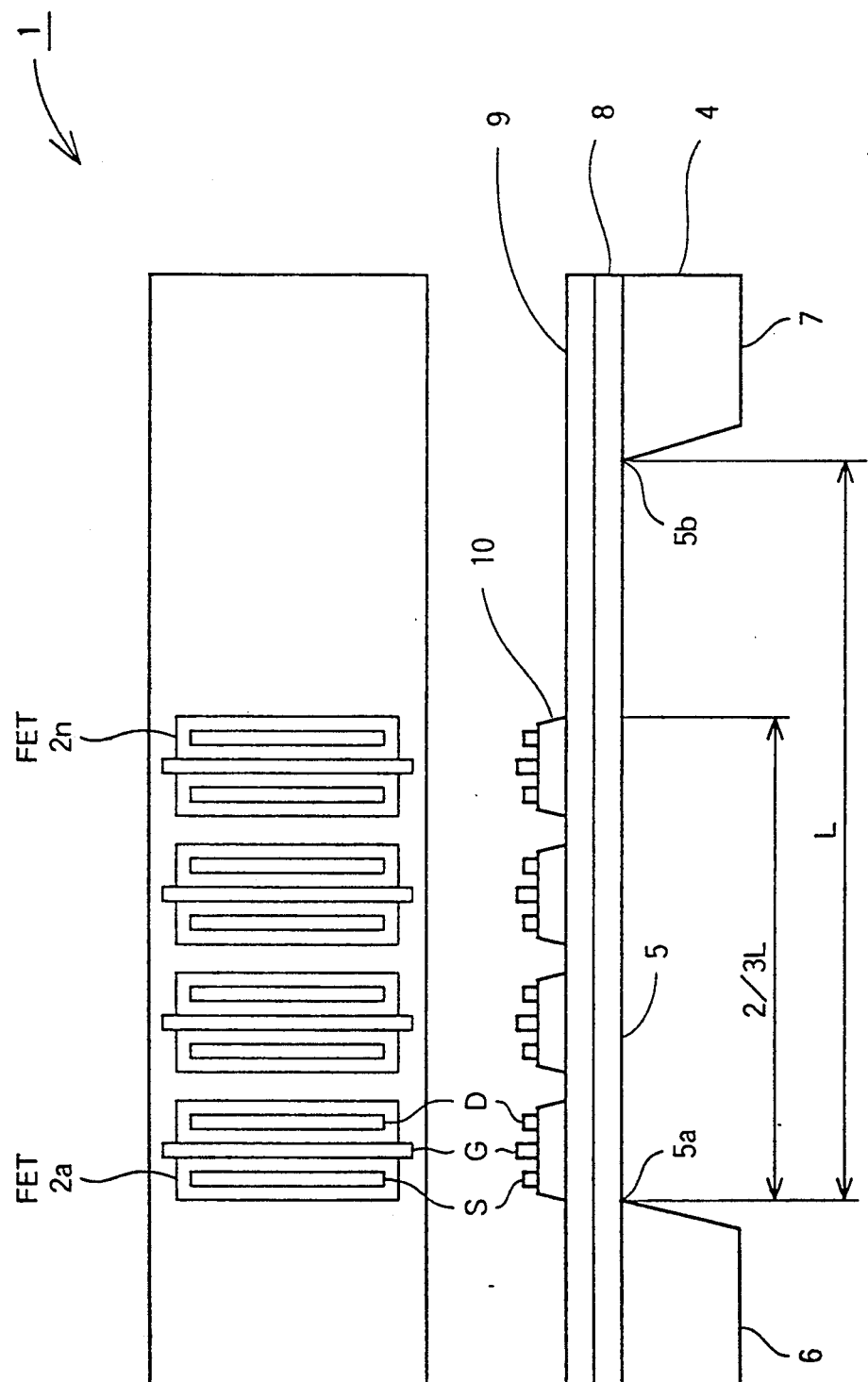

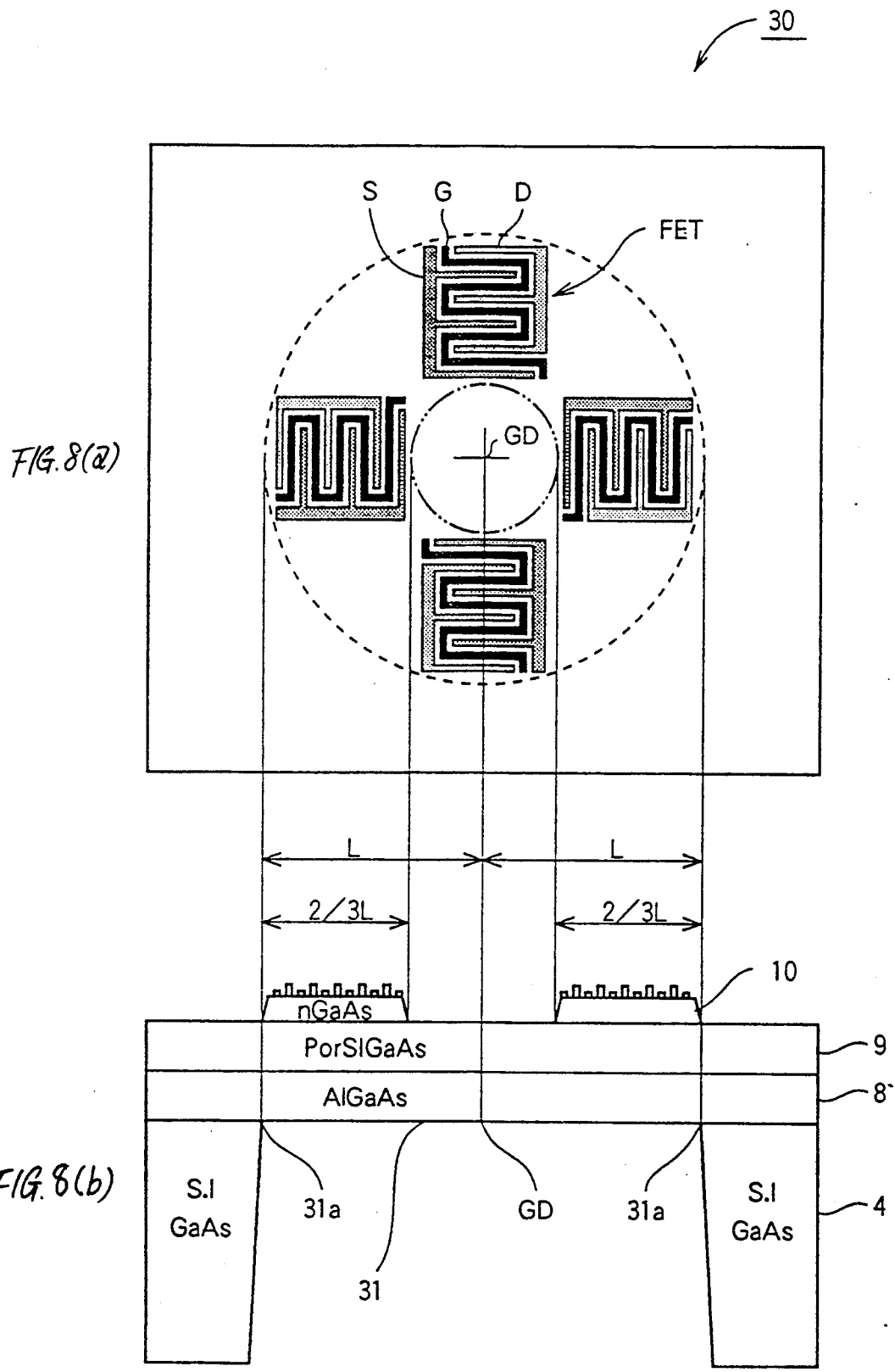

SEMICONDUCTOR STRESS SENSOR MESFET OR MESFET ARRAY

BACKGROUND OF THE INVENTION

1. Field of the Invention

The present invention relates to a semiconductor sensor, and more particularly to a semiconductor sensor for detecting an external force such as a pressure, an acceleration, or the like.

2. Description of the Relevant Art

It is known in the art from Japanese laid open patent publication No. 53-153537, for example, that when a stress is applied to a field-effect transistor made of a piezoelectric semiconductor such as GaAs, the drain current of the field-effect transistor varies.

The applicant has previously proposed a cantilever-type semiconductor sensor based on the above nature of a field-effect transistor, as disclosed in Japanese laid-open patent publication No. 2-194343.

FIG. 1 of the accompanying drawings shows, in perspective, the external physical structure of the proposed cantilever-type semiconductor sensor. FIG. 2 of the accompanying drawings shows the circuit arrangement of the proposed semiconductor sensor.

As shown in FIG. 1, the cantilever-type semiconductor sensor, generally designated by the reference numeral 101, comprises a semiconductor substrate 102 and a crystalline layer 103 deposited on the semiconductor substrate 102 by way of epitaxial growth. The crystalline layer 103 includes an FET (field-effect transistor) 104. The semiconductor substrate 102 includes a flexible region 105 of reduced thickness defined by a recess in the surface thereof remote from the crystalline layer 103.

The semiconductor substrate 102 includes a fixed region 106 on one side of the flexible region 105 and a weight region 108 on the other side of the flexible region 105. The flexible region 105 has an end 107 adjacent to the fixed region 105 and an end 110 adjacent to the weight region 108.

The electric circuit of the semiconductor sensor 101 includes the FET 104 for detecting a stress developed by an external force that is applied to the weight region 108 at its center of gravity 109, a current-to-voltage (I–V) converter 3 for generating a voltage output corresponding to a drain current ID from the FET 104, a pair of resistors R1, R2 for applying a gate bias voltage VG to the gate G of the FET 104, and a power supply VDD.

The FET 104 has a drain D connected to the power supply VDD. The gate bias voltage VG, which is produced by dividing the voltage from the power supply VDD with the resistors R1, R2, is applied to the gate G of the FET 104.

The current-to-voltage converter 3 comprises an operational amplifier 3a and a feedback resistor 3b. The FET 104 has a source S connected to an inverting input terminal 3c of the operational amplifier 3a. The operational amplifier 3a has a noninverting input terminal 3d grounded. The FET 104 is driven at a constant voltage with the potential difference between the input terminals 3c, 3d of the current-to-voltage converter 3 being substantially zero.

When a stress is applied to the FET 104, the drain current ID of the FET 104 varies, and the variation in the drain current ID is detected and outputted as a voltage output 3e by the current-to-voltage converter 3.

It has been confirmed by a simulation process that a strain or deformation which occurs in the crystalline layer 103 when an external force is applied perpendicularly to the weight region 108 is maximum at the end 107 of the flexible region 105, and is almost zero at the end 110 thereof.

Therefore, the FET 104, which is in the form of a single unit and has a small area, is positioned on the end 107 of the flexible region 105, as shown in FIG. 1, in order to maximize the variation in the drain current ID of the FET 104 thus positioned, i.e., the sensitivity of the semiconductor sensor 101, at the time an external force is imposed on the semiconductor sensor 101.

However, the FET 104 of the type described above is problematic in that the drain current ID suffers irregular fluctuations (noise) even when no stress is applied to the semiconductor sensor 101, and hence no sufficient signal-to-noise ratio is provided in a range of small stresses applied.

SUMMARY OF THE INVENTION

It is an object of the present invention to provide a semiconductor sensor which is of high sensitivity and has a high signal-to noise ratio.

According to the present invention, there is provided a semiconductor sensor comprising a semiconductor substrate, a linear array of field-effect transistors disposed on the semiconductor substrate at spaced intervals along a direction, the field-effect transistors having respective drains electrically connected parallel to each other, respective sources electrically connected parallel to each other, and gates electrically connected parallel to each other, means for applying a gate bias voltage to each of the field-effect transistors, and means for detecting a stress applied to the semiconductor substrate based on a change in a combined output of the field-effect transistors.

According to the present invention, there is also provided a semiconductor sensor comprising a semiconductor substrate, a single field-effect transistor disposed on the semiconductor substrate, the field-effect transistor having a comb-shaped drain, a comb-shaped source, and a comb-shaped gate, the comb-shaped drain, source, and gate having respective teeth spaced along a direction, means for applying a gate bias voltage to the field-effect transistor, and means for detecting a stress applied to the semiconductor substrate based on a change in an output of the field-effect transistor.

According to the present invention, there is further provided a semiconductor sensor comprising a semiconductor substrate, an annular array of comb-shaped field-effect transistors disposed on the semiconductor substrate at spaced intervals along a circumferential direction, the field-effect transistors having respective drains electrically connected parallel to each other, respective sources electrically connected parallel to each other, and gates electrically connected parallel to each other, means for applying a gate bias voltage to each of the field-effect transistors, and means for detecting a stress applied to the semiconductor substrate based on a change in a combined output of the field-effect transistors.

The above and further objects, details and advantages of the present invention will become apparent from the following detailed description of preferred embodiments thereof, when read in conjunction with the accompanying drawings.

BRIEF DESCRIPTION OF THE DRAWINGS

FIG. 4(a) is a plan view of the external physical structure of a cantilever-type semiconductor sensor according to an embodiment of the present invention;

FIG. 4(b) is a side elevational view of the external physical structure of the cantilever-type semiconductor sensor shown in FIG. 4(a);

FIG. 8(a) is a plan view of the external physical structure of a diaphragm-type semiconductor sensor according to still another embodiment of the present invention; and FIG. 8(b) is a side elevational view of the external physical structure of the diaphragm-type semiconductor sensor shown in FIG. 8(a).

DETAILED DESCRIPTION OF THE PREFERRED EMBODIMENTS

Figure 1:
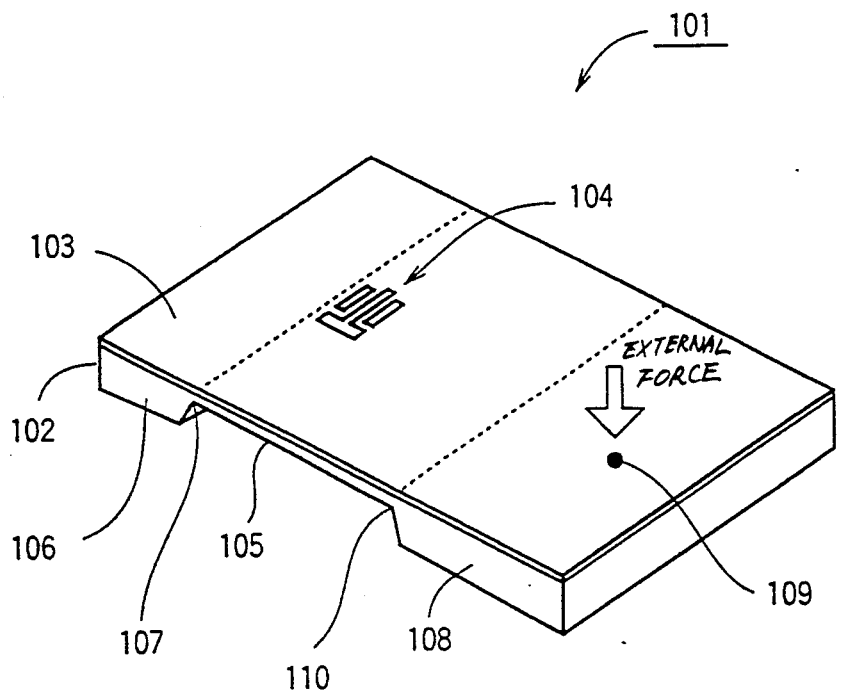
FIG. 1 is a perspective view of the external physical structure of a previously proposed semiconductor sensor.
Figure 2:
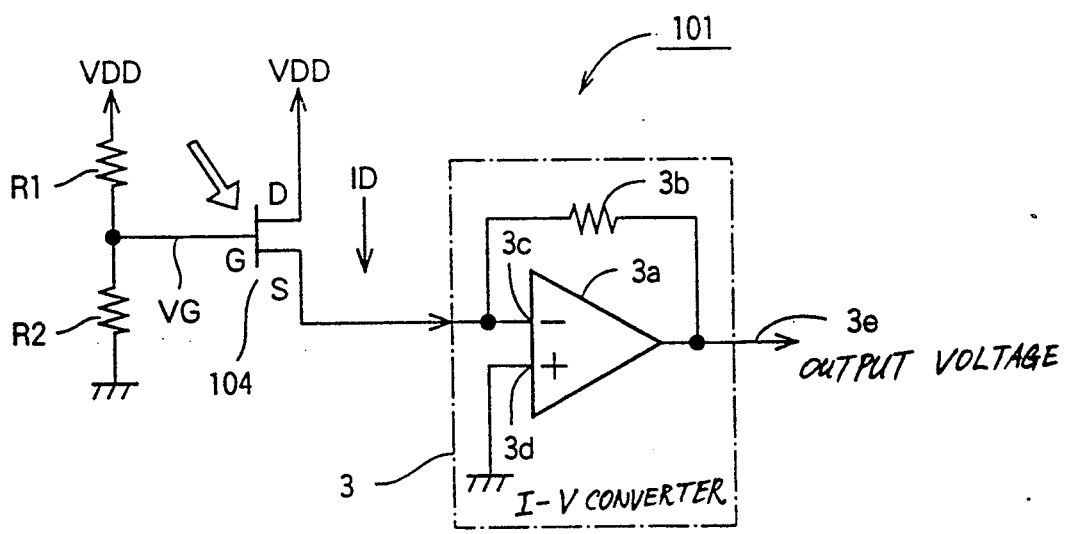
FIG. 2 is a circuit diagram of the electric circuit of the previously proposed semiconductor sensor.

Like or corresponding parts are denoted by like or corresponding reference characters throughout views.

Figure 3:
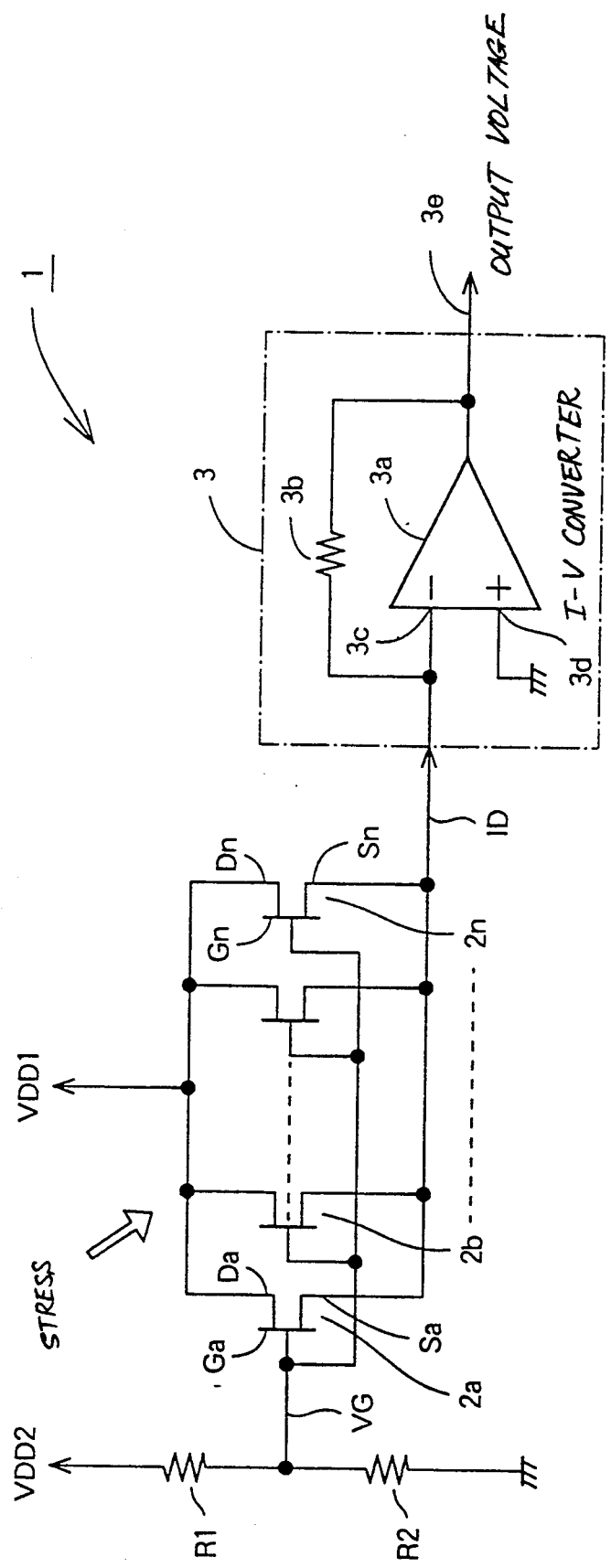
FIG. 3 is a circuit diagram of an electric circuit of a semiconductor sensor according to the present invention.

FIG. 3 shows the electric circuit of a semiconductor sensor according to the present invention.

As shown in FIG. 3, a semiconductor sensor 1 comprises a plurality of FETs $2a \sim 2n$ having drains, sources, and gates electrically connected parallel to each other, a current-to-voltage (I–V) converter 3 for producing a voltage output corresponding to a drain current ID from the FETs $2a \sim 2n$, a pair of resistors R1, R2 for applying a gate bias voltage VG to the gates $Ga \sim Gn$ of the respective FETs $2a \sim 2n$, and two power supplies VDD1, VDD2.

The FETs $2a \sim 2n$ have respective drains $Da \sim Dn$ electrically connected to the power supply VDD1 and respective sources $Sa \sim Sn$ electrically connected to the current-to-voltage converter 3 to keep a constant voltage applied between the drains and sources of the FETs $2a \sim 2n$, so that the output signal of the semiconductor sensor 1 remains unaffected by changes in the ambient temperature around the semiconductor sensor 1.

The power supply VDD2 and the resistors R1, R2 are adjusted to control the potential between the gate and source of each of the FETs $2a \sim 2n$ for selecting the gate bias potential VG in the vicinity of the threshold voltage of the FETs $2a \sim 2n$ thereby making the semiconductor sensor 1 highly sensitive.

When a stress is applied to the FETs $2a \sim 2n$, the respective drain currents $IDa \sim IDn$ thereof vary depending on the applied stress, and the combined drain current ID is converted by the current-to-voltage converter 3 into a voltage output $3e$ that is available as an output signal of the semiconductor sensor 1.

FIGS. 4(a) and 4(b) show the external physical structure of a cantilever-type semiconductor sensor according to an embodiment of the present invention.

The semiconductor sensor 1 is of the cantilever type, and comprises an elongate semiconductor substrate 4 of GaAs which is etched on its reverse side in a final stage of fabrication, providing a thin flexible region 5, a fixed region 6 disposed on one side of the flexible region 5, and a weight region 7 disposed on the other side of the flexible region 5. The flexible region 5 has an end $5a$ adjacent to the fixed region 6, and an end $5b$ adjacent to the weight region 7. Although the flexible region 5 is defined by an opening defined completely through the substrate 4 in FIG. 4(b), such region could alternatively comprise a reduced thickness portion of the substrate 4 similar to the flexible region 105 in FIG. 1.

A layer 8 of AlGaAs is deposited on the semiconductor substrate 4 according to the MBE process. The AlGaAs layer 8 is thick enough to serve as a selective etching stopper layer when the reverse side of the semiconductor substrate 4 is etched to form the flexible region 5 according to a wet etching process based on jet polishing.

The etching solution used when the semiconductor substrate 4 is etched to form the flexible region 5 should preferably comprise a mixture of $NH_4OH$ and $H_2O$.

Then, a semiconductor or P-type buffer layer 9 of GaAs is formed by way of crystalline growth on the AlGaAs layer 8 according to the VPE process. Thereafter, an N-type GaAs layer is formed as an active FET layer 10 by way of crystalline growth on the GaAs buffer layer 9 according to the VPE process.

The active FET layer 10 is then selectively etched away according to the wet etching process, thus providing a plurality of mesa active FET layers 10 in a range of about ⅔ of the full length L of the flexible region 5. The mesa active FET layers 10 are spaced at intervals in the longitudinal direction of the semiconductor substrate 4.

Thereafter, source, drain, and gate electrodes are formed on each of the active FET layers 10 according to the liftoff method.

The gate electrodes should preferably comprise a lower portion of titanium (Ti) and an upper portion of tungsten (W). The gate electrodes of such a structure are advantageous in that since the titanium adheres intimately to the active FET layers 10 and the tungsten has a large modulus of direct elasticity, the FETs thus formed are highly sensitive to stresses applied thereto.

Actually, an upper wiring layer and an insulating film are provided to connect the FETs parallel to each other, but are omitted from illustration for the sake of clarity.

Figures 5A, 5B:
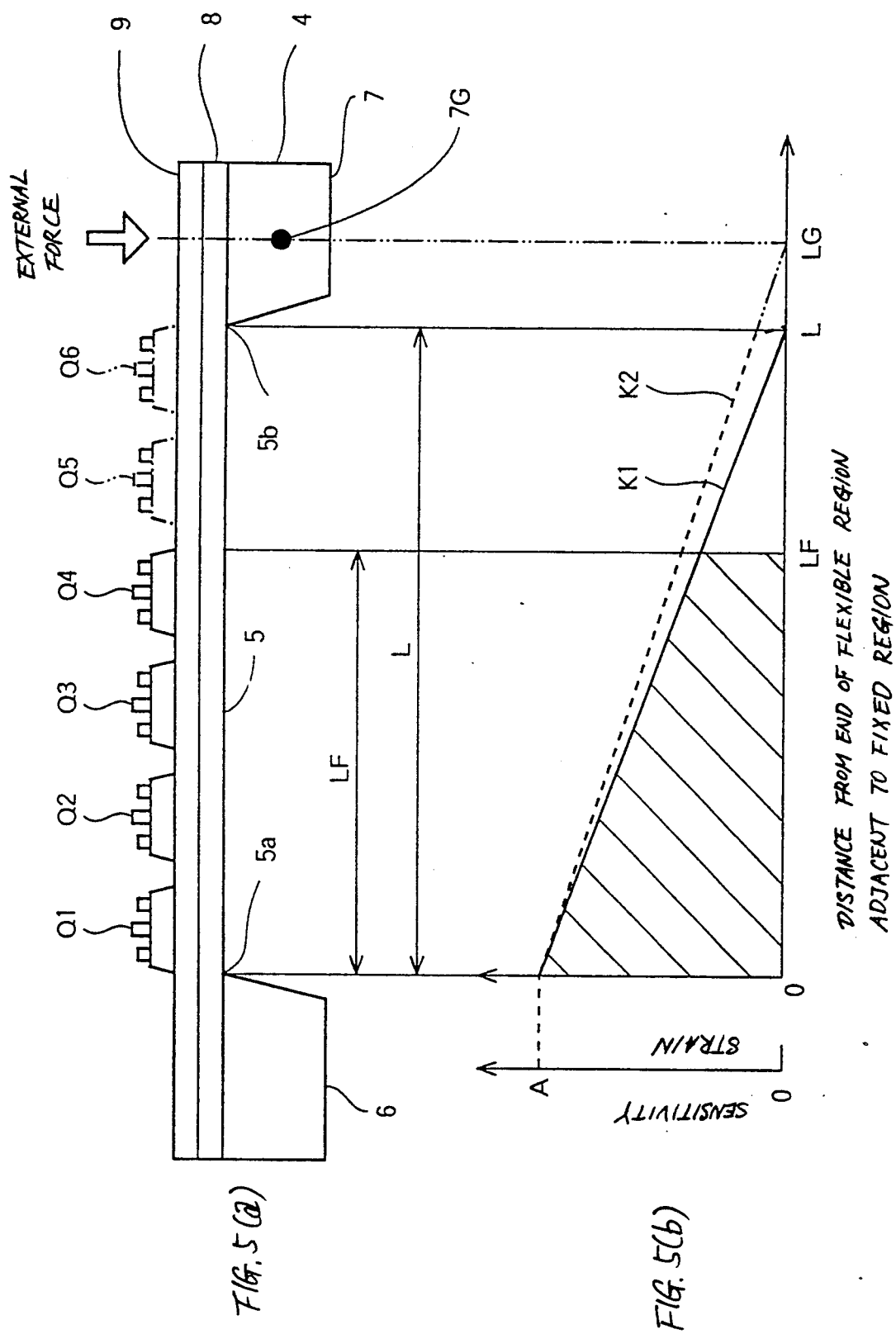
FIGS. 5(a) and 5(b) show the relationship between FETs, strains or sensitivity, and distances from an end of a flexible region adjacent to a fixed region, with the cantilever-type semiconductor sensor shown in FIG. 4(a)

The range in which the FETs are positioned will be described below with reference to FIGS. 5(a) and 5(b). FIGS. 5(a) and 5(b) show the relationship between the FETs, strains or sensitivity, and distances from the end of the flexible region adjacent to the fixed region, with the cantilever-type semiconductor sensor shown in FIG. 4(a).

When an external force is applied to the weight region 7 at its center of gravity 7G, a strain or deformation which occurs in the semiconductor substrate 4 is maximum at the end 5a of the flexible region 5, and is almost zero at the end 5b thereof.

The drain currents of the FETs disposed over the flexible region 5 vary depending on the magnitude of the strain of the semiconductor substrate 4. Therefore, a variation (hereinafter referred to as a sensitivity) which is developed in the drain current when a predetermined load is applied to the weight region 7 at the center of gravity 7G in the direction indicated by the large arrow decreases as the FET is shifted toward the weight region 7, as shown in FIG. 5(b).

Now, it is assumed that the FET which is located on the end 5a of the flexible region 5 has a sensitivity A, and that n FETs of substantially the same configuration and characteristics are disposed at substantially equal intervals within a range LF (FIGS. 5(a) and 5(b)) from the end 5a, the n FETs being connected parallel to each other. The total sensitivity S of the n FETs corresponds to the hatched area shown in FIG. 5(b). The area of the hatched trapezoidal shape is expressed by the following equation (1):

$$S = \left(A + A\frac{L - LF}{L}\right)\frac{LF}{2} \quad (1)$$

$$= \left(1 + 1\frac{LF}{L}\right)\frac{A\,LF}{2}$$

$$= A\,LF - \frac{A\,LF^2}{2L}$$

In the above equation, the area of the hatching trapezoidal shape is determined using a solid line K1 that represents zero sensitivity at the end 5b of the flexible region 5 adjacent to the weight region 7. However, it is more accurate to determine the hatched area using a dotted line K2 that represents zero sensitivity at the center of gravity 7G.

Even when no stress is applied to the semiconductor sensor 1, the drain currents of the respective FETs vary irregularly, and such fluctuations (AC component) of the drain currents are produced as noise outputs from the FETs. The combined noise output is increased if the number of parallel-connected FETs is increased. Since the noise of each of the FETs is produced at random, the combined noise output is not simply equal to the multiple of the noise output of a single FET and the number n of FETs used, but the multiple of the noise output of a single FET and the square root of the number n.

Therefore, the combined signal-to-noise ratio of the n FETs that are located within the range or distance LF from the end 5a, as show in FIG. 5(a), is given by the following equation (2):

$$\frac{S}{N} = \frac{A\,LF - \frac{A\,LF^2}{2L}}{B\sqrt{n}} \quad (2)$$

Insofar as the number n of FETs is proportional to the distance LF, the number n may be replaced with LF. The equation (2) is modified into the following equation (3), which is then differentiated into the equation (4):

$$\frac{S}{N} = \frac{A}{B} LF^{\frac{1}{2}} - \frac{A}{2BL} LF^{\frac{3}{2}} \quad (3)$$

$$\frac{d}{dL}\frac{S}{N} = \frac{A}{2B} LF^{-\frac{1}{2}} - \frac{3A}{4BL} LF^{\frac{1}{2}} \quad (4)$$

Then, the range in which the FETs are disposed for a maximum signal-to-noise ratio is determined by equalizing the equation (4) to zero. More specifically, the righthand side of the equation (4) is equalized to zero, as indicated by the following equation (5):

$$\frac{A}{2B} LF^{-\frac{1}{2}} - \frac{3A}{4BL} LF^{\frac{1}{2}} = 0 \quad (5)$$

Both sides of the equation (5) are multiplied by the square root of LF, providing the following equation (6):

$$\frac{A}{2B} - \frac{3A}{4BL} LF = 0 \quad (6)$$

The equation (6) is then modified into the following equation (7):

$$LF = \frac{3}{2}L \quad (7)$$

Therefore, the signal-to-noise ratio is maximum if the FETs are disposed in the range which is approximately ⅔ of the full length L of the flexible region 5.

A specific arrangement of the FETs for the maximum signal-to-noise ratio will be described below with reference to FIGS. 5(a), 5(b), and 6 and the following table:

TABLE

| VOLTAGE | FET | | | | | |
|---|---|---|---|---|---|---|
| | Q1 | Q2 | Q3 | Q4 | Q5 | Q6 |
| NOISE OUTPUT VOLTAGE (mV) WHEN NO STRESS IS APPLIED | 4 | 4 | 4 | 4 | 4 | 4 |
| OUTPUT VOLTAGE (mV) WHEN STRESS IS APPLIED | 16 | 14 | 12 | 10 | 8 | 6 |
| SENSITIVITY (mV) (OUTPUT - NOISE) | 12 | 10 | 8 | 6 | 4 | 2 |

As shown in FIG. 5(a), a total of six FETs, including those indicated by the imaginary-lines, each disposed in an area having a width of about L/6, are formed on the buffer layer 9.

The FETs, which are indicated respectively by Q1~Q6, produce respective noise output voltages (converted from respective currents) when no stress is applied, respective output voltages (converted from respective currents) when a predetermined stress is applied, and have respective sensitivities, as shown in the above table. The FET Q1 singly has a signal-to-noise ratio of 3. When the FETs Q1, Q2 are connected parallel to each other, their combined signal-to-noise ratio is 3.89 as indicated by the following equation (8):

$$\frac{S}{N}(Q1 \sim Q2) = \frac{12 + 10}{4 \times \sqrt{2}} = 3.89 \quad (8)$$

Figure 6:
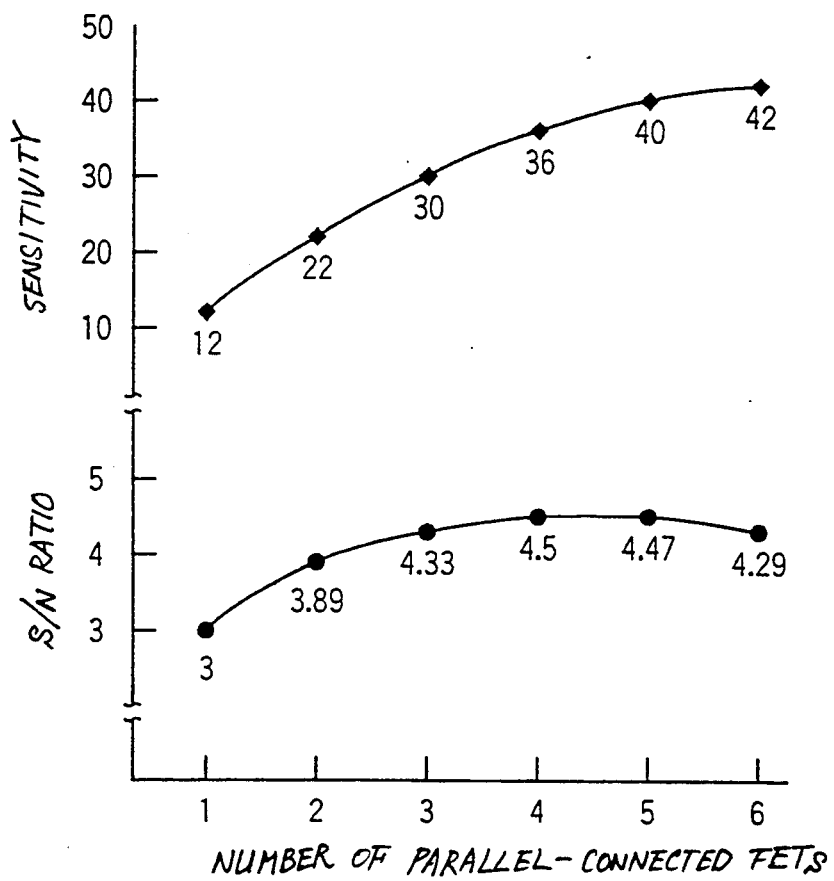
FIG. 6 is a graph showing the relationship between the numbers of parallel-connected FETs, sensitivities, and signal-to-noise ratios with the cantilever-type semiconductor sensor shown in FIG. 4(a)

The combined signal-to-noise ratios of three, four, five, and six parallel-connected FETs are shown in FIG. 6.

As shown in FIG. 6, when the number of FETs used is increased, the increase in the combined sensitivity thereof is gradually reduced, and the combined noise is reduced in proportion to the square root of the number of FETs used. The signal-to-noise ratio is large if the FETs are disposed in the distance which is about ⅔ of the total length of the flexible region 5.

Since the semiconductor sensor 1 has a plurality of FETs connected parallel to each other, the output signals produced respectively by the FETs in response to an applied stress are added into a large output voltage. Since the combined noise level of the FETs is lower than the sum of noise levels of the respective FETs because of their irregularities, there is a resultant increase in the signal-to-noise ratio.

Figures 7A, 7B:
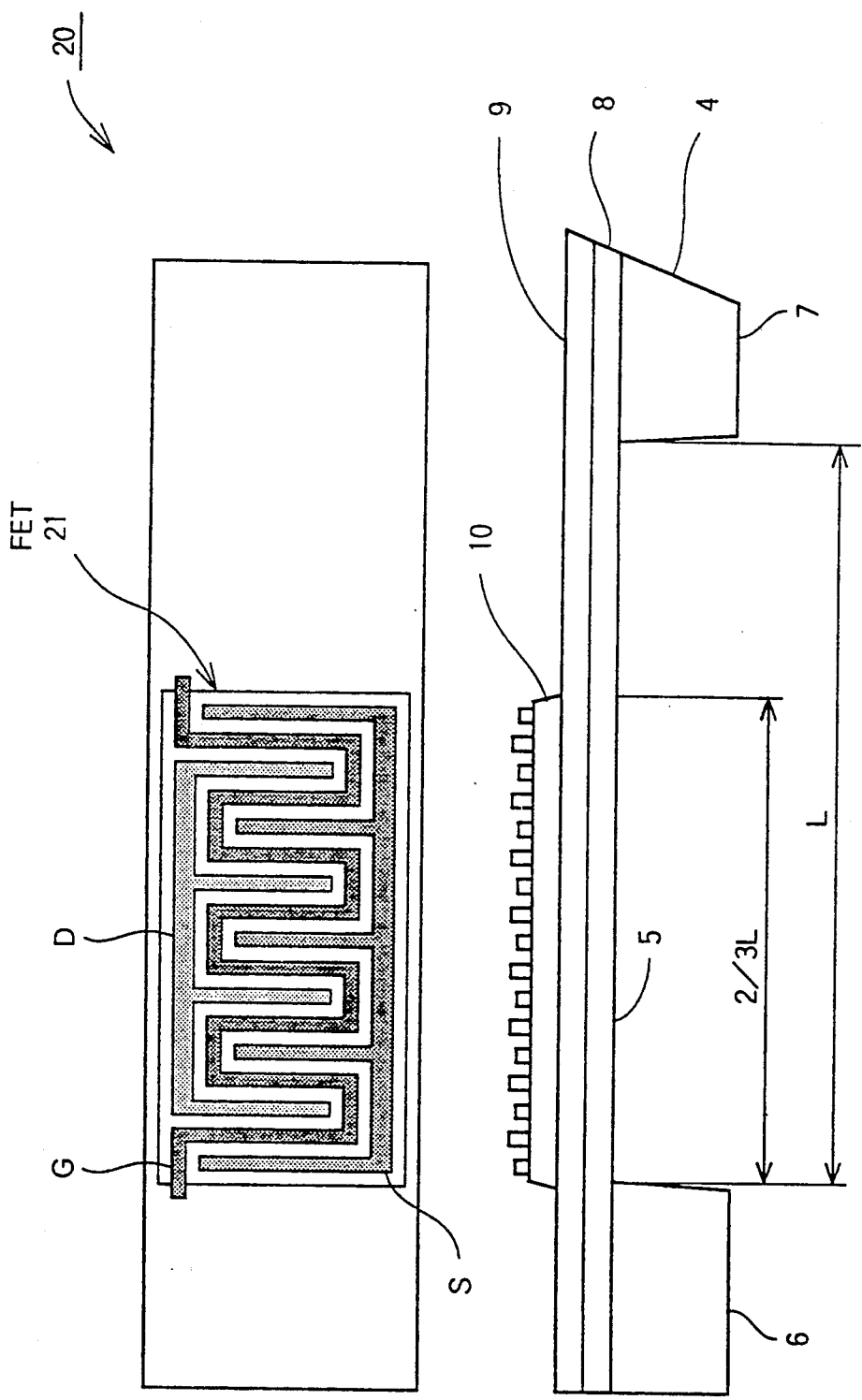
FIG. 7(a) is a plan view of the external physical structure of a cantilever-type semiconductor sensor according to another embodiment of the present invention.
FIG. 7(b) is a side elevational view of the external physical structure of the cantilever-type semiconductor sensor shown in FIG. 7(a)

FIGS. 7(a) and 7(b) show the external physical structure of a cantilever-type semiconductor sensor according to another embodiment of the present invention.

In the embodiment shown in FIGS. 7(a) and 7(b), the semiconductor sensor, generally designated by the reference numeral 20, has a single FET 21 including a source S, a drain D, and a gate G each of a comb shape, for the detection of an applied stress. More specifically, the comb-shaped source S, the comb shaped drain D, and the comb-shaped gate G have respective teeth that are spaced in the longitudinal direction of the semiconductor substrate 4.

Since the single FET 21 is employed, the semiconductor sensor 20 does not require interconnections and electrode terminals which would otherwise be necessary to connect a plurality of FETs. The comb-shaped source S, drain D, and gate G of the single FET 21 are functionally equivalent to an array of small FET cells with respect to stresses applied, located within a desired range on the flexible region 5. With the single FET 21 being comb-shaped, and also with no interconnections and no electrode terminals being employed, more FET cells can be disposed in the desired range than if individual FETs were used. Therefore, the semiconductor sensor 20 has a high signal-to-noise ratio based on the aforesaid principle.

FIGS. 8(a) and 8(b) show the external physical structure of a diaphragm-type semiconductor sensor according to another embodiment of the present invention.

The semiconductor sensor, generally designated by the reference numeral 30, is designed for detecting an applied pressure. The semiconductor sensor 30 includes a diaphragm-shaped circular flexible region 31 having an radially outer end 31a that is spaced a distance or radius L from the center of gravity GD of the flexible region 31. A plurality of radial comb-shaped FETs that are circumferentially spaced are disposed in a range that is ⅔ of the distance L radially from the end 31a. The FETs have respective electrodes, and like electrodes are connected parallel to each other.

Each of the comb-shaped FETs may be of a sectorial configuration such that the gate is longer radially outwardly toward the outer circumference of the flexible region 31 and progressively shorter toward the center thereof, and the drain, source, and gate are disposed in arcuate areas. The sectorial comb-shaped FETs may extend fully circumferentially over the flexible region 31.

Each of the drain, source, and gate of each FET may alternatively be of a pattern composed of concentric elements.

While each of the FETs is formed on the substrate 4 of GaAs in the above embodiments, it may be formed on a silicon substrate. The active FET layers 10 may be of a piezoelectric semiconductor such as InP or the like.

The device configuration of each of the FETs is not limited to the mesa MESFET, but may be a planar thermally insulative gate MESFET or HEMT. The crystalline growth layers may be formed according to the MO-VPE process, rather than the MBE or VPE process.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

We claim:

1. A semiconductor sensor comprising:
   a semiconductor substrate;
   a linear array of field-effect transistors disposed on said semiconductor substrate at spaced intervals along a direction, said field-effect transistors having respective drains electrically connected parallel to each other, respective sources electrically connected parallel to each other, and gates electrically connected parallel to each other;
   means for applying a gate bias voltage to each of said field-effect transistors; and
   means for detecting a stress applied to said semiconductor substrate based on a change in a combined output of said field-effect transistors.

2. A semiconductor sensor according to claim 1, wherein said semiconductor substrate has a flexible region which is flexible under a stress applied thereto, said flexible region having a length L in said direction, said field-effect transistors being positioned within a range which is about ⅔ of said length L from an end of said flexible region.

3. A semiconductor sensor according to claim 2, wherein said flexible region is defined by a recess formed in a surface of the semiconductor substrate, said semiconductor substrate having a fixed region on one side of said flexible region and a weight region on the other side of said flexible region, said end of the flexible region being positioned adjacent to said fixed region.

4. A semiconductor sensor comprising:
   a semiconductor substrate;
   a single field-effect transistor disposed on said semiconductor substrate, said field-effect transistor having a comb-shaped drain, a comb-shaped source, and a comb-shaped gate, said comb-shaped drain, source, and gate having respective teeth spaced along a direction;
   means for applying a gate bias voltage to said field-effect transistor; and
   means for detecting a stress applied to said semiconductor substrate based on a change in an output of said field-effect transistor.

5. A semiconductor sensor according to claim 4, wherein said semiconductor substrate has a flexible region which is flexible under a stress applied thereto, said flexible region having a length L in said direction, said field-effect transistor having one end positioned within a range which is about ⅔ of said length L from an end of said flexible region.

6. A semiconductor sensor according to claim 5, wherein said flexible region is defined by a recess formed in a surface of the semiconductor substrate, said semiconductor substrate having a fixed region on one side of said flexible region and a weight region on the other side of said flexible region, said end of the flexible region being positioned adjacent to said fixed region.

7. A semiconductor sensor comprising:
a semiconductor substrate;
an annular array of comb-shaped field-effect transistors disposed on said semiconductor substrate at spaced intervals along a circumferential direction, said field-effect transistors having respective drains electrically connected parallel to each other, respective sources electrically connected parallel to each other, and gates electrically connected parallel to each other;
means for applying a gate bias voltage to each of said field-effect transistors; and
means for detecting a stress applied to said semiconductor substrate based on a change in a combined output of said field effect transistors.

8. A semiconductor sensor according to claim 7, wherein said semiconductor substrate has a circular flexible region which is flexible under a stress applied thereto, said flexible region having a radius L, said field-effect transistors being positioned within a range which is about ⅔ of said radius L from a radially outer end of said flexible region.

9. A semiconductor comprising:
a semiconductor substrate;
an arrangement of field effect-transistor portions disposed on said substrate, said field-effect transistor portions including a plurality of drain portions electrically connected parallel to each other, a plurality of source portions electrically connected parallel to each other, and a plurality of gate portions electrically connected parallel to each other;
means for applying a gate bias voltage to each of said gate portions; and
means for detecting a stress applied to said semiconductor substrate based on a change in a combined output of said drain portions.

10. A semiconductor sensor according to claim 9, wherein said field-effect transistor portions comprise a linear array of field-effect transistors disposed on said semiconductor substrate at spaced intervals along a direction, said field-effect transistors having respective drains electrically connected parallel to each other, respective sources electrically connected parallel to each other, and gates electrically connected parallel to each other.

11. A semiconductor sensor according to claim 9, wherein said field-effect transistor portions are jointly formed as a single field-effect transistor, in which said drain portions are jointly formed as a comb-shaped drain, said source portions are jointly formed as a comb-shaped source, and said gate portions are jointly formed as a comb-shaped gate, said comb-shaped drain, source and gate having respective teeth spaced along a direction.

12. A semiconductor substrate according to claim 9, wherein said field-effect transistor portions comprise an annular array of field-effect transistors disposed on said semiconductor substrate at spaced intervals along a circumferential direction, said field-effect transistors having respective drains electrically connected parallel to each other, respective sources electrically connected parallel to each other and respective gates electrically connected parallel to each other.

13. A semiconductor substrate according to claim 12, wherein each of said field-effect transistors is comb-shaped.

* * * * *

UNITED STATES PATENT AND TRADEMARK OFFICE
CERTIFICATE OF CORRECTION

PATENT NO. : 5,225,705
DATED : July 6, 1993
INVENTOR(S) : Hiyama, et. al.

It is certified that error appears in the above-indentified patent and that said Letters Patent is hereby corrected as shown below:

Column 6, line 30, change "$LF = \frac{3}{2} L$" to --$LF = \frac{2}{3} L$--;

Column 9, line 33 (claim 9, line 1), after "semiconductor" insert --sensor--.

Signed and Sealed this

Fifteenth Day of March, 1994

Attest:

BRUCE LEHMAN

Attesting Officer     Commissioner of Patents and Trademarks